INVENTORS:
Lothar Laermer
Robert J. Schenk
By [signature]
Thomas W. Kennedy
ATTORNEYS INVENTORS:
Lothar Laermer
Robert J. Schenk By [signature]
Thomas W. Kennedy
ATTORNEYS.

Dec. 12, 1972 L. LAERMER ET AL 3,706,010

PACKAGING STRUCTURE HAVING COOLING MEANS FOR A MULTIPLICITY OF HERMETIC MODULES FOR INTEGRATED CIRCUIT CHIPS

Filed Aug. 20, 1971 3 Sheets-Sheet 3

INVENTORS:
Lothar Laermer
Robert J. Schenk

By [signature]
[signature]
ATTORNEYS 3,706,010

PACKAGING STRUCTURE HAVING COOLING MEANS FOR A MULTIPLICITY OF HERMETIC MODULES FOR INTEGRATED CIRCUIT CHIPS

Lothar Laermer, Paramus, and Robert J. Schenk, Pompton Plains, N.J., assignors to The Singer Company, Little Falls, N.J.

Filed Aug. 20, 1971, Ser. No. 173,367
Int. Cl. H05k 7/20
U.S. Cl. 317—100 5 Claims

ABSTRACT OF THE DISCLOSURE

An improved hermetically sealed module is provided for packaging Large Scale Integrated Circuit (LSI) chips for computers, and the like; and an improved higher level packaging structure is provided for a multiplicity of such modules. The individual modules incorporate a heat exchanger by which cooling air is brought within the proximity of the heat dissipating semiconductor element in the module while still maintaining the integrity of the hermetically sealed enclosure, and an improved electrical terminal assembly is provided for connecting the semiconductor element within the module to outside circuitry. The higher level packaging structure consists of two contact block assemblies to which motherboards, a front panel, a rear panel, a bottom inlet air plenum and a top outlet air plenum are mounted, together with a contact assembly for engagement with the contacts on the individual modules. The contacts of the contact assembly are cam operated into engagement with the module contacts after the module is inserted so as to minimize the insertion force requirements.

BACKGROUND OF THE INVENTION

The invention herein described was made in the course of or under a contract or subcontract thereunder with the Department of the Navy.

It is well established in the packaging of integrated circuit chips, and the like, for the chip to be supported on an insulating ceramic base, and for an hermetically sealed enclosure to be provided on the base for the chip. It is also usual to form a plurality of electrical leads on the base which serve as terminal connections, the leads being connected to circuitry on the chip within the enclosure by fine wires, or by other techniques. The hermetically sealed enclosure is necessary to protect the integrated circuit chip from the outside environment in order to prevent contamination and possible passivation of the surfaces of the chip.

The present invention, in one of its aspects, provides an improved module which is particularly suited for large scale integration (LSI) chips, and which not only provides the necessary connections to the chip, or other electronic element within the hermetically sealed enclosure, but also provides an integral heat exchanger for transferring heat away from the electronic element.

A further aspect of the invention provides a higher level packaging structure for the aforesaid modules. The higher level packaging structure is similar in some respects to the packaging structure described, for example, in copending application Ser. No. 82,873 filed May 24, 1971 in the names of J. Fred Rathjen and Lothar Laermer, now United States Patent 3,648,113, and which is assigned to the present assignee, and in United States Patent 3,395,318 which issued July 30, 1968 to Lothar Laermer et al., and which also is assigned to the present assignee.

DETAILED DESCRIPTION OF THE ILLUSTRATED EMBODIMENT

The module shown in FIGS. 1–5 includes, for example, a base 10 which may be formed, for example, of $Al_2O_3$ (alumina), and which has been isostatic dry pressed and fired to optimize its mechanical properties. In a constructed embodiment, for example, a 0.085 inch thick slab of 96% alumina is used, and the slab being square, and measuring four inches by four inches.

A heat exchanger member 12 is mounted on one side of the base 10, the heat exchanger having a fin-like configuration, as shown, so as to define a plurality of channels extending across the surface of the base. The heat exchanger 12 may be formed, for example, by pressing a basic alumina block to the illustrated configuration, and by then firing the block and grinding it to the desired critical dimensions. Alternatively, the heat exchanger may be machined from a basic alumina block, or it may be fabricated of a high thermal conductivity metal, such as copper.

Figures 4, 5, 7, 8:
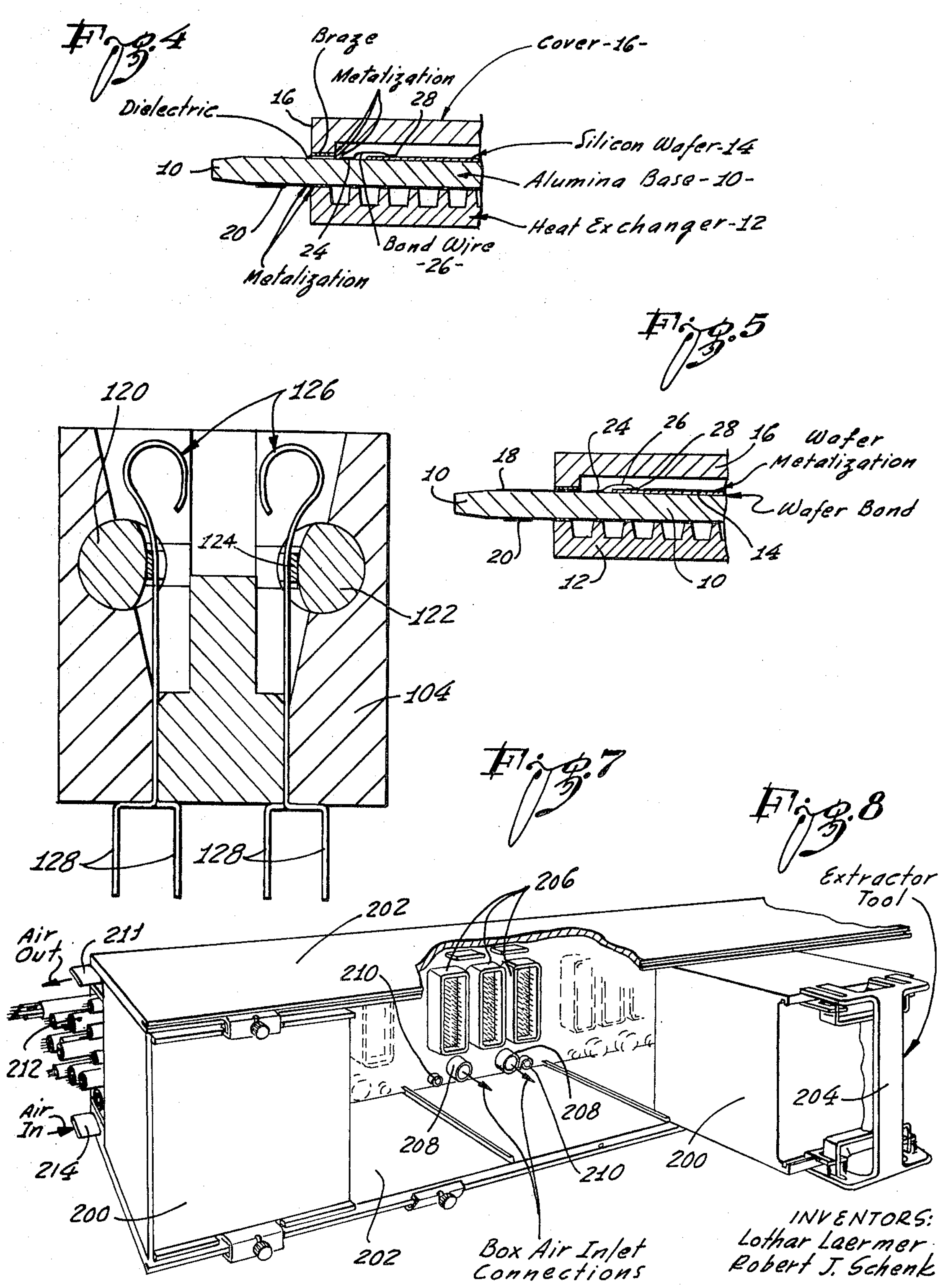
FIG. 4 is another section taken along the line 4—4 of FIG. 2.
FIG 5 is yet another section taken along the line 5—5 of FIG. 2.
FIG. 7 is a section taken substantially along the line 7—7 of FIG. 6, and showing the details of cam operated contacts which are incorporated into the interconnection contact boards of the package of FIG. 6.
FIG. 8 is a perspective representation of a modular system, which incorporates a plurality of packages, such as the package of FIG. 6.

A metalized pattern is formed on the surface of the base 10, and the heat exchanger 12 is mounted on the surface of the base by brazing it, for example, to the metalized pattern, as best shown in FIG. 4. If desired, other methods of attachment of the heat exchanger to the base, such as by a suitable epoxy adhesive, may be used. The use of epoxy has the disadvantage of lower heat conductivity than the braze, but has the obvious advantages of greater compliance for thermal expansion. Moreover, there is no need to grind both sides of the base to a critical flatness when the epoxy is used; also, the use of epoxy leads to ease of manufacture, in that it does not require a metalized pattern on the base. However, the use of epoxy does limit the maximum temperature to which the module may be subjected during further processing.

A silicon semiconductor LSI chip, or wafer, 14 is mounted on the base 10, either directly on the base or recessed into the base, in a manner known to the art. The chip 14, for example, may be a three inch diameter circular wafer, as is the case in a constructed embodiment of the invention. The various integrated circuits are formed on the chip 14. The base 10 provides an insulated support which can be selectively metalized for establishing connections to the integrated circuits of the chip 14. While the chip 14 in the illustrated embodiment represents, for example, a monolithic LSI semiconductor element, individual integrated circuit chips, hybrid substrates, and the like, may be supported on the base 10.

A cover 16 is also provided which, likewise, may be formed of alumina, and which may be sealed to the base 10 in the same manner as the heat exchanger 12. The cover 16 provides a hermetic seal for the wafer 14. The cover 16, as shown, is basically an inverted cup design using a dry-pressed alumina part with the sealing surface ground flat, and then metallized with molybdenum-manganese, so that a hermetic seal is assured.

Figures 1, 2:
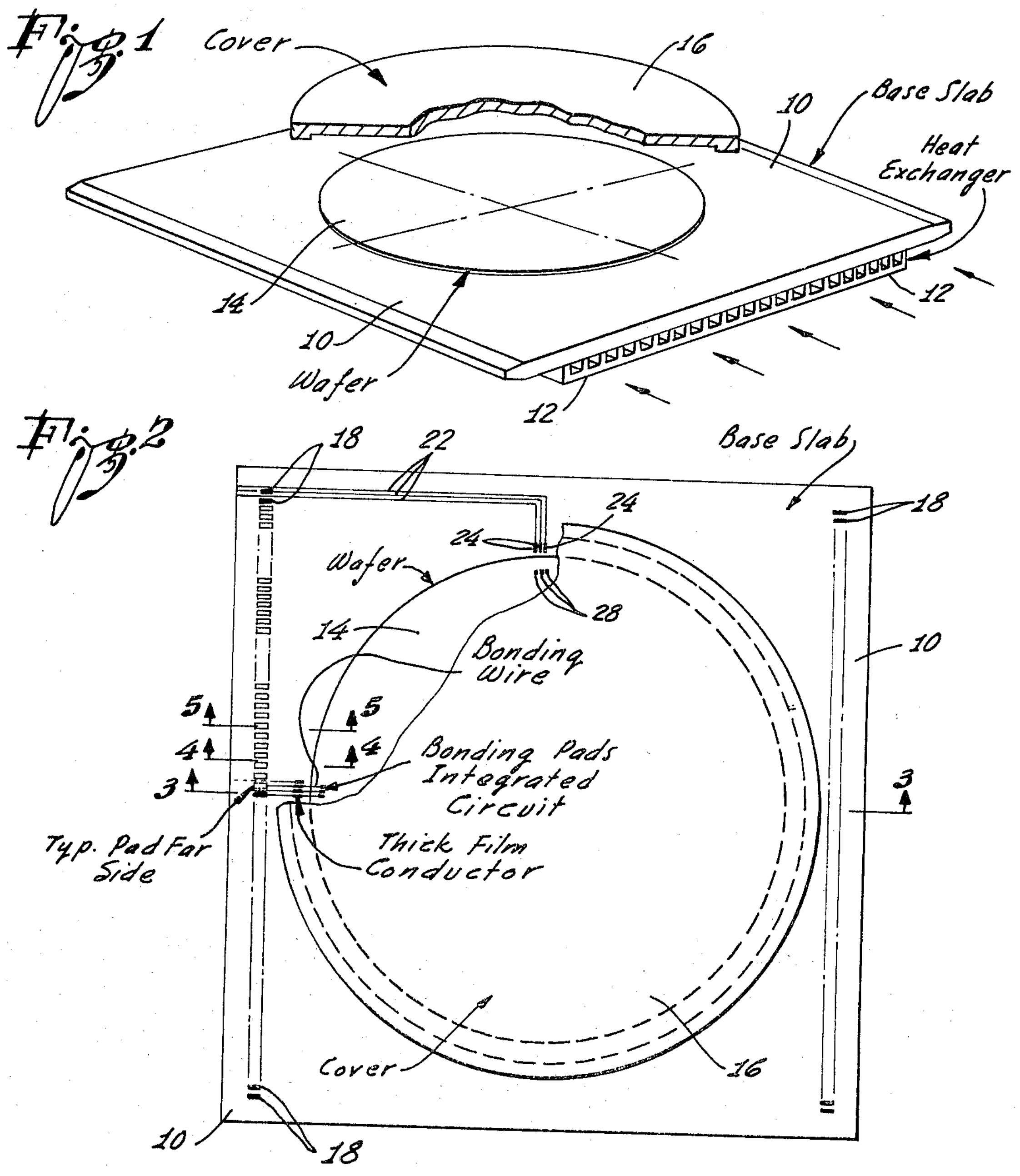
FIG. 1 is a perspective exploded view of an improved hermetically sealed LSI module, which incorporates an integral heat exchanger and electrical contact substrate in accordance with the invention.
FIG. 2 is a top plan view of the module of FIG. 1 partially broken away to reveal some of the internal components thereof.
Figure 3:
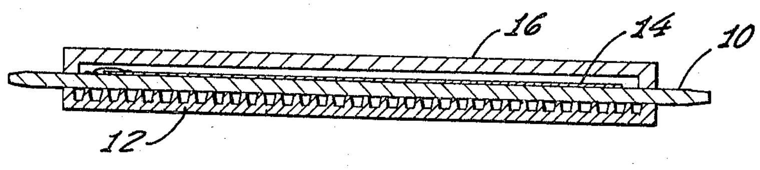
FIG. 3 is a section taken along the line 3—3 of FIG. 2.

A series of electrical contacts are formed along the opposite edges of the base 10, as designated 18 in FIG. 2. In addition, a corresponding series of electric contacts 20 are formed on the opposite side of the base 10. The construction is such, for example, that electrical feed-through leads 22 are formed on the base by selective metallizing techniques. These leads extend into the interior of the hermetically sealed chamber formed by the cover 16.

A first group of the aforesaid leads extend across the surface of the base towards the left-hand edge of the base in FIG. 2; and a second group of the leads extend across the surface of the base to the right-hand edge of the base in FIG. 2. The odd numbered leads, for example, extending to both edges of the base terminate in a series of upper electrical conductor pads 18; whereas the even numbered leads extend around the respective edges of the base 10 to connect to a series of electrical conductor pads 20 on the underside of the base.

In a constructed embodiment, each of the two opposing edges of the base 10 contains one hundred and fifty electrical contact pads, with seventy-five on each side. The feed-through leads 22 in FIG. 2, for example, extend into the interior of the cover 16 and are connected to a series of corresponding electrically conductive pads 24, the pads 24 being formed on the base 10 within the cover 16. As shown in FIGS. 4 and 5, for example, bond wires 26 connect the individual pads 24 to corresponding electrodes 28 on the silicon LSI semiconductor wafer 14. The leads 22 which extend around the edge of the base may be produced by successive thick film printings on both sides of the base 10 and edge combined with the edge serration to facilitate isolation.

To seal the package, the electrical feed-through leads 22 are over-printed with a de-vitrifying glaze which when fired will produce an alumina base crystalline structure suitable for further printing and firing of a molybdenum-manganese sealing ring pattern. The de-vitrifying glaze is also placed over the leads 22, so that only the pads 18 and 20 are left exposed. This permits circuit line protection, and also permits greater dimensional tolerance between the pads 18, and the leads 22 which pass between the pads 18 to the pads 20 on the opposite face of the base.

Figure 6:
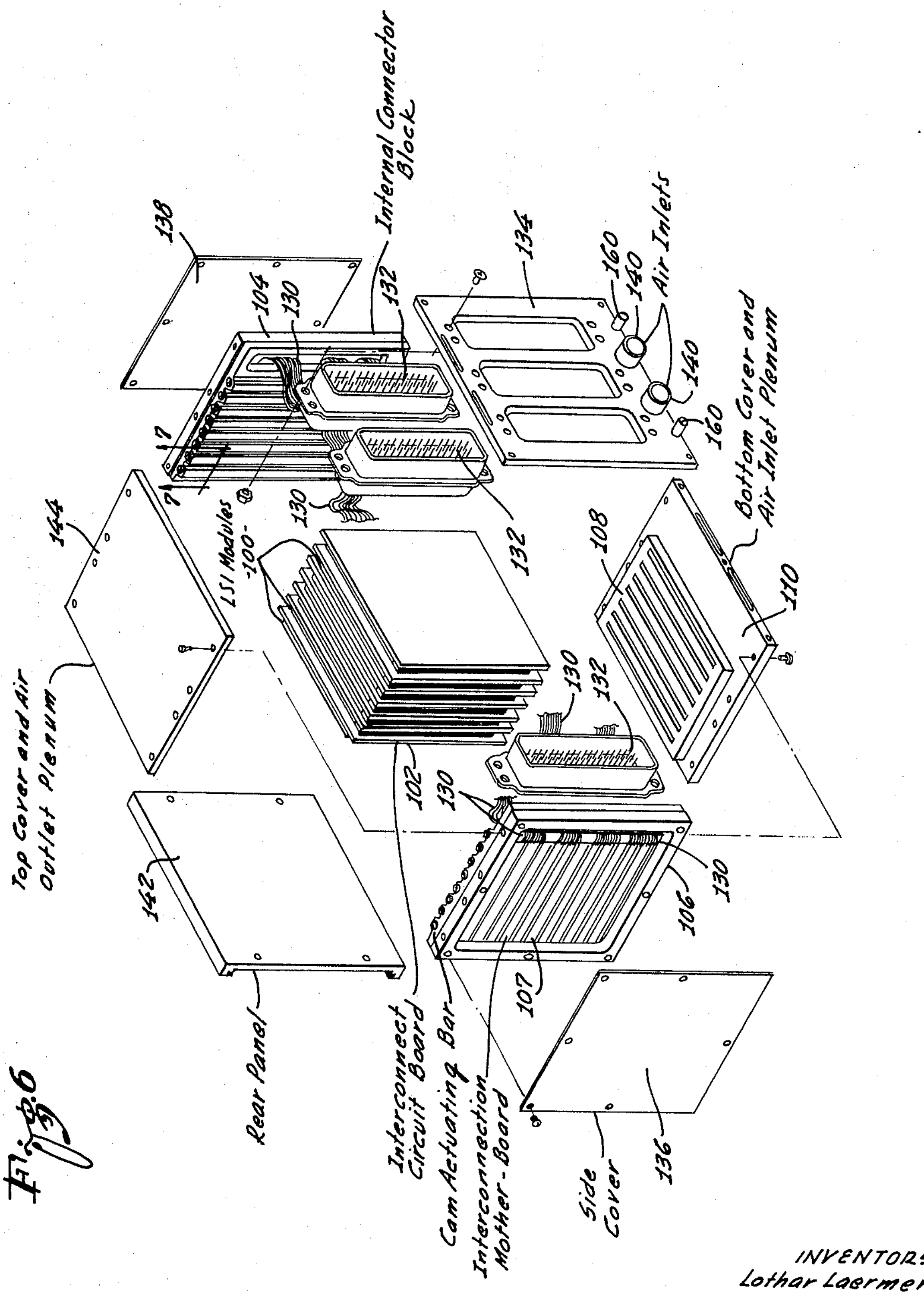
FIG. 6 is an exploded perspective representation of the higher level package in which a multiplicity of modules, such as shown in FIGS. 1–5, are mounted.

In accordance with a further feature of the invention, a multiplicity of modules 100, such as the modules described in conjunction with FIGS. 1–5, are supported in a stacked condition in a higher level package structure, such as represented by the exploded perspective representation of FIG. 6. The modules 100 are supported in a stacked condition, together with an interconnecting circuit board 102, between a pair of contact blocks 104 and 106 which, in turn, support respective interconnection motherboards, such as the motherboard 107. The stack of modules 100 and circuit board 102 are supported on a platform 108 on a bottom member 110. The bottom member also forms an air inlet plenum, and pressurized air introduced into the bottom, flows up through slots in the platform 108 and between the ribs of the various heat exchangers 12 associated with the LSI modules 100.

A plurality of contacts are provided on the aforesaid contact blocks 104 and 106, which receive the contact pads 18 and 20 of the individual modules 100. These contacts are cam-operated so that there is zero insertion force when the individual modules are moved into place. However, upon operation of the cams, four to twelve ounce contact force between the contacts and the pads of the modules may be achieved. As best shown in FIG. 7, a pair of cams 120 and 122 are retained in bearing surfaces in the contact blocks 104 and 106. The cams engage corresponding insulated cam followers 124 which bear against the various contact pairs designated 126. The contact pairs 126, in turn, engage the contact pads 18 and 20 of the individual modules 100 described in conjunction with FIGS. 2, 4 and 5.

Upon rotation of either the cam 120 or cam 122, for example, seventy-five contacts in the constructed embodiment are pushed by the insulated cam followers 124 out of their protected slots in the contact blocks and against the pads 18 and 20 on the LSI modules 100. Each cam has an integral part, an ear which upon rotation locks the module in the corresponding connector block. The tails 128 of the contacts 126 are staggered to provide maximum area for connection to the leads through the connecting blocks 104 and 106. It will be appreciated that four cams are required with each module to lock and unlock the contacts of the module, and that the single modules may be removed from the package without disturbing the adjacent modules, merely by rotating the corresponding cams.

The various connecting leads from the motherboards are in the form of flat flexible cables 130, for example, and these cables connect to appropriate input/output multi-pin connectors 132. The connectors 132 are mounted on an external connector panel 134 which, in turn, is mounted to one edge of the bottom cover 110, and forms one of the sides of the package. Side covers 136 and 138 are provided which support and mount the connecting blocks 106 and 104 within the package, and which form side covers for the structure. Air inlets 140 are provided in the connector panel 134 which couple pressurized air from an appropriate source to the air inlet plenum in the bottom cover 110. A rear panel 142 is provided for the assembly, as is a top cover 144, which also forms an air outlet plenum chamber for the package thereby achieving a closed system.

A plurality of packages, such as designated 200 in FIG. 8, each constructed to include the elements shown in FIG. 6, may be mounted in a modular computer system, or the like, of the type shown in FIG. 8. The modular computer system of FIG. 8 includes, for example, a support bracket 202, and the various packages 200 are supported in a slidable manner in the bracket 202. The individual packages may be removed, for example, by an appropriate extraction tool 204. When inserted in place, the contacts of the connectors 132 of the individual packages 200 are received in mating connectors 206, and the air inlets 140 couple with air inlet connectors 208.

Pins 160 (FIG. 6) may be provided on the external connector panel 134, and these pins are received in corresponding bushings 210 as the package is slipped into place. The various electrical connections, together with the circulating air may be provided in cables 212 and conduits 214 and 216 mounted adjacent the rear face of the bracket 202.

The invention provides, therefore, an improved packaging structure for integrated circuit semiconductor chips; the structure having a modular configuration, and incorporating a multiplicity of modules for the individual chips, wherein cooling air is brought within the proximity of the heat dissipating elements in the individual modules, while the integrity of the hermetically sealed enclosure of each module is maintained. An efficient means for interconnecting the electrodes of the integrated circuit chip in each of the modules to outside circuitry is provided by means of an alternating lead-pad pattern, as described.

A package is also provided for a multiplicity of the aforesaid modules, each with its integral heat exchanger, the main frame of the package consisting of two contact block assemblies 104 and 106 to which motherboards, such as the interconnection motherboard 107, the front panel 134, the rear panel 142, the lower inlet air plenum 110, and the top outlet air plenum 144, are mounted. As described, the air inlet plenum 110 serves as the bottom, and the air outlet plenum 144 serves as the top cover of the package. The modules 100 are retained in grooves running vertically in the contact blocks 104 and 106.

The contact arrangement in the contact blocks 104 and 106 are ideally suited to a package having high density interconnection requirements. As described, the contacts are cam operated after the individual modules have been inserted, thereby requiring zero insertion force. Upon cam operation of the contacts, optimum contact forces are attained. Wiping action is obtained through proper contact cam design.

As also described, the contact cams, such as the cams 120 and 122 of FIG. 7, are retained in bearing surfaces in the contact blocks 104 and 106 which, in turn, are mounted in hollow frames which form the contact block assemblies. The contact blocks can be molded to accommodate one or more modules, such as shown in FIG. 6. Standard contact blocks can be combined to form an expandable higher level package, such as described in conjunction with FIG. 8.

Cooling air is circulated through the modules entering, for example, from the air inlet connections 208 of FIG. 8 and through the air inlet 140 in the front panel 134 into the air inlet plenum in the bottom 110, and passing up through the ribs the heat exchangers 12 associated with the individual modules 100, and out the top plenum 144. The configuration provides air at the inlet temperature for each of the modules 100, since a parallel circulation system is provided. Parallel circulation systems of the type described results in significantly lower component temperatures than that of conventional series heat exchangers which provide higher interface temperatures to successive modules. Gaskets may be provided to prevent air leakage at the lower and upper module-plenum interfaces.

As described above, connections from the motherboards, such as the motherboard 107 to the external connectors 132 are made by means of flexible cables 130. Communication between the motherboard 107 and the corresponding motherboard in the contact block 104 are handled, for example, by interconnecting circuit boards 102, as shown in FIG. 6.

As also described, the resulting package of FIG. 6 forms a module for the next higher packaging level, such as shown in FIG. 8. The bracket 202 in FIG. 8, contains the inter-box wiring and central circulation duct, and it serves as a structural member and mounting frame for the packages 200. Electrical connectors, such as the connectors 206, cooling air connectors, such as the connectors 208, and box guide pin bushings, such as the bushings 210, are mounted on the rack for the purposes described.

The invention provides, therefore, an improved structure for an LSI chip module and associated heat sink, and it also provides an efficient package whereby a cooling fluid is directed in a parallel manner through the individual modules. The latter package may also have the feature of cam operated contacts for zero insertion force, as also described.

While a particular embodiment of the invention has been shown and described, modifications may be made. It is intended in the following claims to cover all modifications which fall within the spirit and scope of the invention.

What is claimed is:

1. A package structure supporting a plurality of electrical circuit modules with each module including a flat base member, a heat-exchanger member mounted on a first surface of said base member and having a series of integral ribs spaced from one another affixed to said first surface of said base member defining a multiplicity of channels therewith extending across said surface, an electronic element mounted on the second surface of said base member, and a cover member mounted on said second surface of said base member and extending over said electronic element to form a hermetically sealed enclosure for said electronic element, said base member extending beyond the periphery of said cover member and including a multiplicity of electricity contact pads formed on said base member and extending along said second surface thereof, and a corresponding plurality of electrical leads formed on said second surface of said base member and extending from respective ones of said pads across said second surface and into the aforesaid hermetically sealed enclosure;

said package structure supporting said modules in a stacked relationship including a plurality of side panels enclosing said modules, at least one of the side panels of said package structure defining an inlet for introducing pressurized fluid through the aforesaid channels defined by said heat exchanger member in each of said modules, at least one circuit board in said stack establishing electrical connections with at least one of said modules, and connector block members in said package structure supporting said at least one circuit board and said circuit modules.

2. The combination defined in claim 1 wherein said connector blocks supporting said stack of circuit modules in said package structure includes cam operated contacts mounted on said connector blocks for making selective electrical connection with said circuit modules.

3. The circuit module defined in claim 1, in which said multiplicity of electrical contact pads are disposed adjacent one another to form a first series contiguous to one edge of said base member, and which includes a second series of electrical contact pads formed on said first surface of said base, and which includes a further plurality of electric leads formed on said second surface and extending around the aforesaid edge into respective electric contact with said pads of said second series.

4. The circuit module defined in claim 1, in which said base member is formed of an electrically insulating material.

5. The circuit module defined in claim 1, in which said electronic element comprises a large scale integrated circuit semiconductor chip member.

References Cited

UNITED STATES PATENTS

| | | | |
|---|---|---|---|
| 3,404,215 | 10/1968 | Burks | 174—DIG 3 |
| 3,480,837 | 11/1969 | Feldmann | 317—100 |
| 3,495,132 | 2/1970 | Anhalt | 317—101 DH |
| 3,609,463 | 9/1971 | Laboue | 317—101 CC |

OTHER REFERENCES

IBM Technical Disclosure Bulletin, vol. 12, No. 5, October 1969, p. 728, "Ceramic Substrate With Inherent Heat Exchanger," Pilgram.

ROBERT K. SCHAEFER, Primary Examiner

G. P. TOLIN, Assistant Examiner

U.S. Cl. X.R.

174—15 R